United States Patent [19]

Kyuma

[11] Patent Number: 5,488,416

[45] Date of Patent: Jan. 30, 1996

[54] IMAGE SENSING METHOD AND APPARATUS IN WHICH THE EXPOSURE TIME MAY BE VARIED

[75] Inventor: Kenji Kyuma, Yokohama, Japan

[73] Assignee: Canon Kabushiki Kaisha, Tokyo, Japan

[21] Appl. No.: 403,120

[22] Filed: Mar. 13, 1995

Related U.S. Application Data

[63] Continuation of Ser. No. 313,399, Sep. 27, 1994, abandoned, which is a continuation of Ser. No. 2,277, Jan. 8, 1993, abandoned, which is a continuation of Ser. No. 783,214, Oct. 28, 1991, Pat. No. 5,194,957.

[30] Foreign Application Priority Data

Nov. 2, 1990 [JP] Japan ................................. 2-295202

[51] Int. Cl.$^6$ ................................................. H04N 3/14
[52] U.S. Cl. .................................... 348/296; 348/312
[58] Field of Search ........................... 348/294, 296, 348/311, 312; H04N 3/14

[56] References Cited

U.S. PATENT DOCUMENTS

| | | | |
|---|---|---|---|
| 4,626,915 | 12/1986 | Takatsu | 358/213.19 |
| 4,734,773 | 3/1988 | Ueda | 358/213.13 |
| 4,743,778 | 5/1988 | Takatsu et al. | 358/213.19 |
| 4,851,915 | 7/1989 | Yang et al. | 358/213.19 |
| 4,875,100 | 10/1989 | Yonemoto et al. | 358/213.19 |
| 5,031,048 | 7/1991 | Naruto et al. | 358/213.19 |
| 5,097,340 | 3/1992 | Tanabe et al. | 358/213.19 |
| 5,194,957 | 3/1993 | Kyuma | 358/213.19 |

FOREIGN PATENT DOCUMENTS 59-33980  2/1984  Japan.
59-105777 6/1984  Japan.

Primary Examiner—Joseph Mancuso
Assistant Examiner—Wendy R. Greening
Attorney, Agent, or Firm—Fitzpatrick, Cella, Harper & Scinto

[57] ABSTRACT

An image sensing apparatus including an image sensing device for receiving a light signal, performing a photoelectric conversion, and generating image information. The device also includes a first type semiconductor substrate, and a second type semiconductor layer formed on the first type semiconductor substrate. In addition, there is provided a light receiving portion formed on the second type semiconductor layer. This portion receives a light signal, performs a photoelectric conversion, and generates image information. Moreover, there is control circuitry for controlling the image sensing device such that image information is output repeatedly once each reading period nT (where n is an integer equal to or greater than two and T is a field period of a standard television signal). Information corresponding to a partial interval T1 within the reading period nT is carried to the first type semiconductor substrate. There is also provided altering circuitry for altering the length of the partial interval T1.

20 Claims, 6 Drawing Sheets

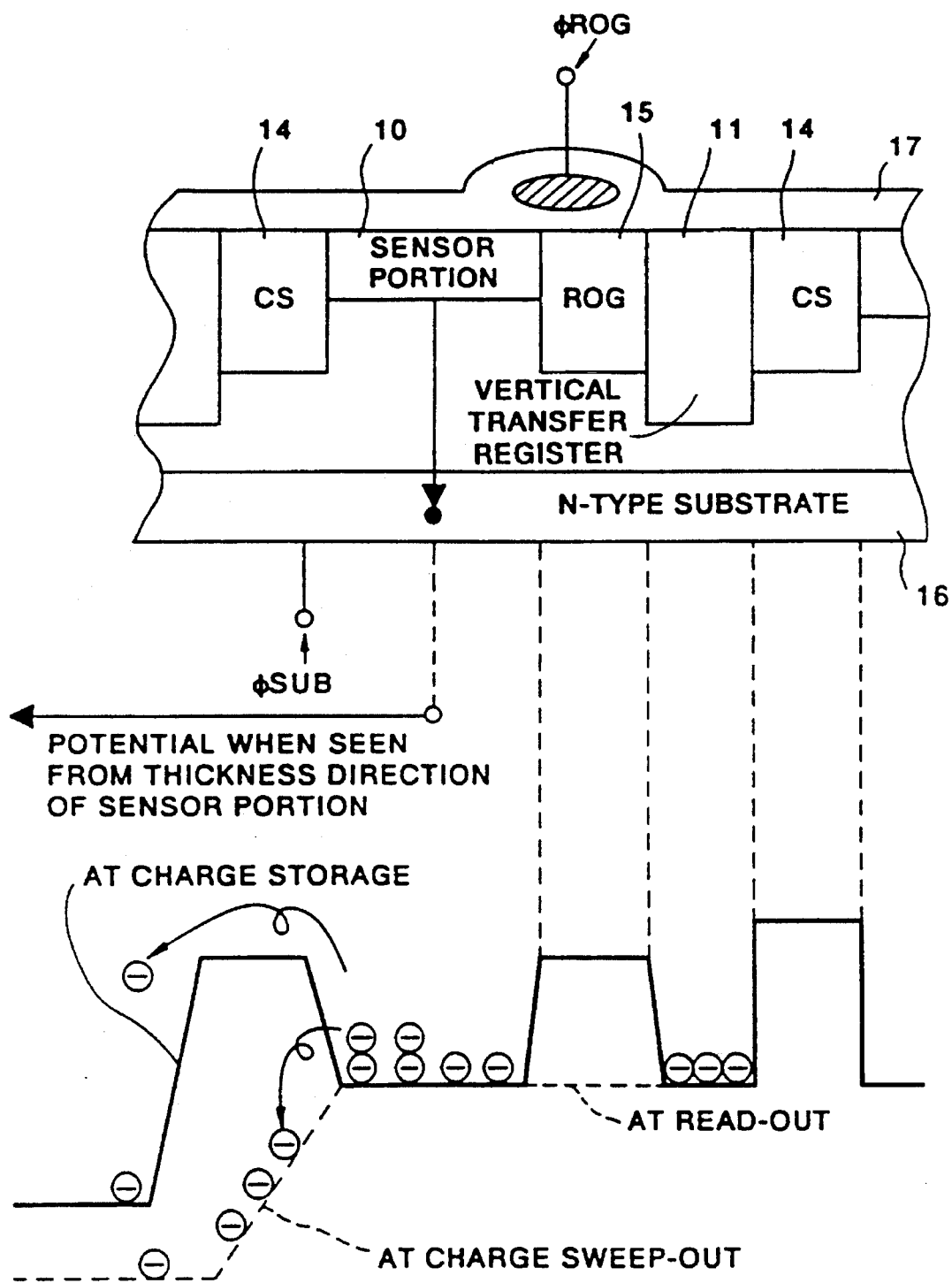
F I G. 4

IMAGE SENSING METHOD AND APPARATUS IN WHICH THE EXPOSURE TIME MAY BE VARIED

This application is a continuation of application Ser. No. 08/313,339 filed Sep. 27, 1994, now abandoned, which is a continuation of Ser. No. 08/002,277, filed Jan. 8, 1993, now abandoned, which is a continuation of Ser. No. 07/783,214, filed Oct. 28, 1991, now U.S. Pat. No. 5,194,957.

BACKGROUND OF THE INVENTION

This invention relates to the control of solid-state image sensors used, for example, in a video camera or the like.

When a subject is photographed and a standard television signal is formed in a video camera, ordinarily the exposure time of an image sensor incorporated within the video camera is set to be the same as a time (one field interval) equivalent to one period of the periods (field periods) of a vertical synchronizing signal of the standard television signal (this is well-known field reading).

However, depending upon the subject to be photographed, there are cases where it is desired to make the exposure time longer than one field interval because the illumination or the subject is inadequate, by way of example. Consequently, a method (well-known frame reading) has been proposed in which the exposure time of the image sensor is set to a time equivalent to two periods of the field periods by specially contriving the timing at which the signal is read from the image sensor, and by using an image memory.

Frame reading will be described with reference to FIGS. 1 through 3.

FIG. 1 is a block diagram illustrating the construction of the circuitry of a video camera for performing frame reading. The circuitry includes a CCD 1 for performing a photoelectric conversion, a CCD driver circuit 2 for driving the CCD 1, a synchronizing signal generating circuit 3 for generating various synchronizing signals necessary in order to form a standard television signal, a timing control signal 4 for controlling the timing of the control of the exposure time based upon a signal from the synchronizing signal generating circuit 3, a signal processing circuit 5 for forming a luminance signal (Y) and color-difference signals (R-Y, B-Y) from the signal outputted by the CCD 1, an A/D converting circuit 6 for converting an analog output signal from the signal processing circuit 5 into a digital signal, an image memory 7 for storing and outputting the output signal from the A/D converting circuit 6 in dependence upon a signal from the timing control circuit 4, a D/A converting circuit 8 for converting the digital output from the image memory 7 into an analog signal, and an encoder circuit 9 for forming the standard television signal from a luminance signal (Y') and color difference signals [(R-Y)', (B-Y)'] outputted by the D/A converting circuit 8.

FIG. 2 is a plan view of the CCD 1 and schematically illustrates the structure of a so-called interline transfer-type CCD. Numeral 10 denotes a sensor which performs a photoelectric conversion, 11 a vertical transfer register, 12 a horizontal transfer register, and 13 an output amplifier.

FIG. 3 is a timing chart of signals applied to various portions of the CCD, output signals from various portions of the CCD, and a signal generated by sensor portion 10 of the CCD 1, all at the time of frame reading. As mentioned above, exposure time is twice one field interval in frame reading. In FIG. 3, $V_D$ represents a vertical synchronizing signal, and $\phi$ROG represents a read-out pulse for transferring the charge, which has accumulated in the sensor portion 10, to the vertical transfer register 11.

As illustrated in FIG. 3, the $\phi$ROG pulse is applied to the CCD 1 only once in two field intervals. As a result, after the charge has accumulated for about two fields, with time $t_0$ serving as the starting point, the charge in the sensor portion 10 is transferred to the vertical transfer register 11 at time $t_1$. Thereafter, the charge is transferred to the horizontal transfer register 12 and outputted to the signal processing circuit 5 via the output amplifier 13.

In one field interval (interval B1) which immediately follows the application of the $\phi$ROG pulse, the charge stored in the sensor portion 10 from time $t_0$ to time $t_1$, namely the charge which has accumulated for about two fields, is outputted as an image signal (SB1) via the output amplifier 13. In the next field interval (interval B2), however, the $\phi$ROG pulse is not applied and therefore a blank signal is outputted.

Accordingly, immediately after the $\phi$ROG pulse is applied to the CCD 1, the A/D converting circuit 6 is driven by the timing control circuit 4 shown in FIG. 1 so that the electric charge stored for about two field intervals outputted by the signal processing circuit 5 is stored in the image memory 7 and outputted to the D/A converting circuit 8 simultaneously (interval B1). Then, in the next field interval (interval B2), the signal stored in the image memory 7 for interval B1 is outputted to the D/A converting circuit 8 (interval B2). As a result, the D/A converting circuit 8 outputs the same signal for two consecutive fields, as illustrated in FIG. 3.

However, in a case where an exposure time greater than one field interval T is required, as when illumination of the subject is inadequate, in the example of the prior art described above, the exposure time of the sensor portion 10 becomes twice the field interval at a stroke if a change is made from a state in which the $\phi$ROG pulse is applied every field to the state in which this pulse is applied every two fields. As a result, exposure time cannot be varied finely in conformity with the brightness of the subject.

SUMMARY OF THE INVENTION

A principal object of the present invention is to realize control of the solid-state image sensor in a video camera so as to make possible exposure control capable of being finely adapted to the brightness of a subject even if the illumination of the subject is low.

Another object of the invention is to provide control of solid-state image sensors in which exposure time can be varied finely even for exposure for a period of time longer than one field.

Still another object of the invention is to provide an image sensing unit in which exposure time can be varied finely even for exposure for a period of time longer than one field.

Yet another object of the invention is to provide a control apparatus for solid-state image sensors in which exposure time can be varied finely even for exposure for a period of time longer than one field.

A further object of the invention is to provide a camera in which exposure time can be varied finely even for exposure for a period of time longer than one field.

A further object of the invention is to provide a method of controlling solid-state image sensors in which exposure time can be varied finely even for exposure for a period of time longer than one field.

In order to solve the aforementioned problems and attain the foregoing objects, an image sensing unit according to the present invention comprises sensing means for receiving a light signal, performing a photoelectric conversion and storing information, reading means for reading the information from the sensing means at a reading period nT, which is n (where n is an integer equal to or greater than 2) times a field period T of a standard television signal, eliminating means for eliminating information from the sensing means which corresponds to a partial interval T1 within the reading period nT, and altering means for altering the width of the partial interval T1.

In the arrangement described above, the image sensing unit of the present invention is such that the partial interval T1 within exposure time nT, which is n (wherein n is an integer equal to or greater than 2) times greater than the field period, is eliminated by the eliminating means. As a result, the exposure time can be finely varied even when exposure is for a period of time longer than one field.

An apparatus for controlling a solid-state image sensor according to the present invention comprises reading control means for controlling the solid-state image sensor in such a manner that information is outputted from the solid-state image sensor at a reading period nT, which is n (where n is an integer equal to or greater than 2) times a field period T of a standard television signal, elimination control means for controlling the solid-state image sensor so as to eliminate information which corresponds to a partial interval T1 within the reading period nT, and alteration control means for controlling the solid-state image sensor so as to alter the width of the partial interval T1.

In the arrangement described above, the control apparatus for a solid-state image sensor according to the present invention is such that the partial interval T1 within exposure time nT, which is n (wherein n is an integer equal to or greater than 2) times greater than the field period of the solid-state image sensor, is eliminated by the elimination control means. As a result, the exposure time can be finely varied even when exposure is for a period of time longer than one field.

A camera in accordance with the present invention comprises sensing means for receiving a light signal, performing a photoelectric conversion and storing information, reading means for reading the information from the sensing means at a reading period nT, which is n (where n is an integer equal to or greater than 2) times a field period T of a standard television signal, eliminating means for eliminating information from the sensing means which corresponds to a partial interval T1 within the reading period nT, altering means for altering the width of the partial interval T1, and converting means for converting the information read out of the sensing means into a standard television signal.

In the arrangement described above, the camera according to the present invention is such that the partial interval T1 within exposure time nT, which is n (wherein n is an integer equal to or greater than 2) times greater than the field period, is eliminated by the eliminating means. As a result, the exposure time can be finely varied even when exposure is for a period of time longer than one field.

A method of controlling solid-state image sensors according to the present invention comprises a first step of eliminating information, which is stored in a sensor portion for performing a photoelectric conversion and storing information, for a partial period T1 from the start of a reading period nT, which is n (where n is an integer equal to or greater than 2) times a field period T of a standard television signal, a second step of storing information in the sensor portion only for an information storage time (nT-T1) which lasts from immediately after the end of the partial interval T1 until the end of the reading period nT, and a third step of reading information from the sensor portion.

In the arrangement described above, the method of controlling a solid-state image sensor according to the present invention is such that the partial interval T1 within exposure time nT, which is n (wherein n is an integer equal to or greater than 2) times greater than the field period, is eliminated. As a result, the exposure time can be finely varied even when exposure is for a period of time longer than one field.

Other objects and advantages besides those discussed above shall be apparent to those skilled in the art from the description of a preferred embodiment of the invention which follows. In the description, reference is made to accompanying drawings, which form a part thereof, and which illustrate an example of the invention. This example, however, is not exhaustive of the various embodiments of the invention, and therefore reference is made to the claims which follow the description for determining the scope of the invention.

BRIEF DESCRIPTION OF THE DRAWINGS

FIG. 4 is a sectional view taken along line A–A' the CCD shown in FIG. 2;

DESCRIPTION OF THE PREFERRED EMBODIMENT

Figure 1:
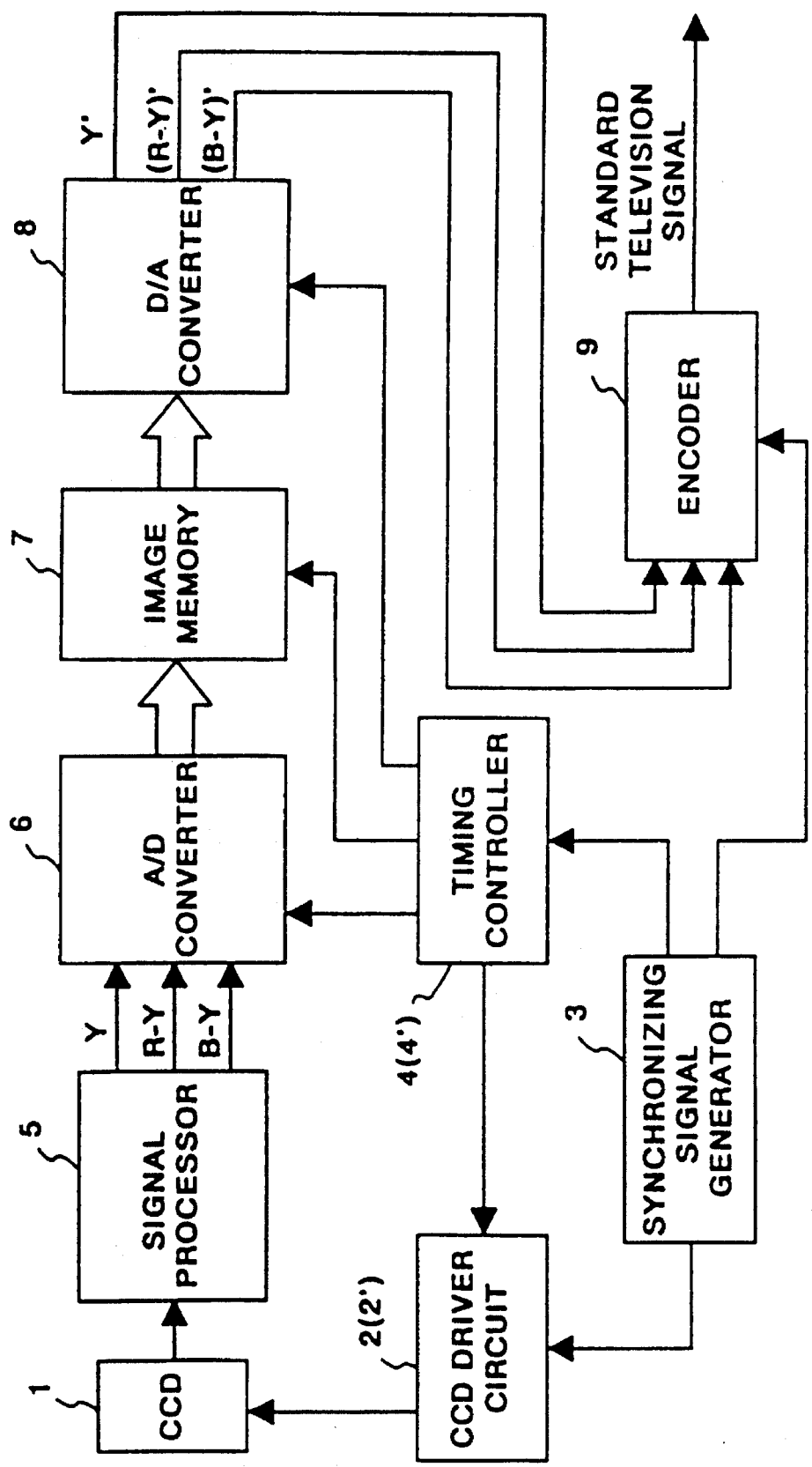
FIG. 1 is a block diagram illustrating the construction of the circuitry of a frame-reading video camera in an embodiment of the invention and in an example of the prior art.

A preferred embodiment for a case where the present invention is applied to a video camera will be described in detail with reference to the accompanying drawings. In terms of the drawings, the circuit arrangement of this video camera is the same as that of the prior-art example shown in FIG. 1. In FIG. 1, portions identical with those in the prior-art example are designated by like reference characters; portions that are different have an apostrophe attached to the reference character.

Since this embodiment employs the action of a so-called electronic shutter, this will be described first.

Figure 2:
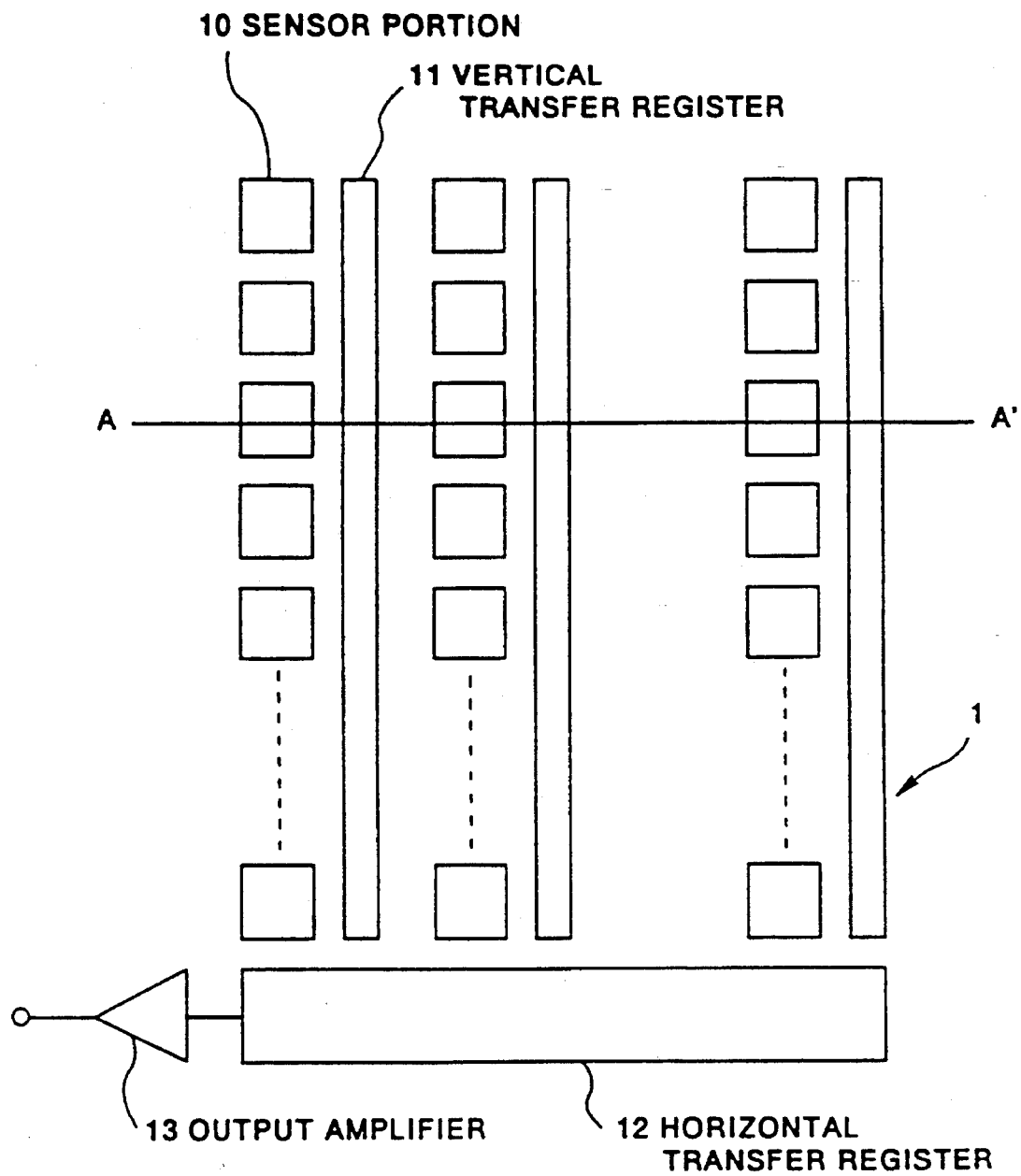
FIG. 2 is a plan view schematically illustrating the structure of a CCD shown in FIG. 1.

FIG. 4 is a sectional view taken along line A–A' of FIG. 2 and a diagram illustrating the states of potentials at various portions corresponding to this cross section.

In FIG. 4, numeral 14 denotes a channel stop (CS) for pixel separation, 15 a read-out gate (ROG) for transferring the electric charge, which has accumulated in the sensor portion 10, to the vertical transfer register 11, 16 a substrate, and 17 an oxide film The operation of the electronic shutter will now be described with reference to FIGS. 4 and 5.

Figure 5:
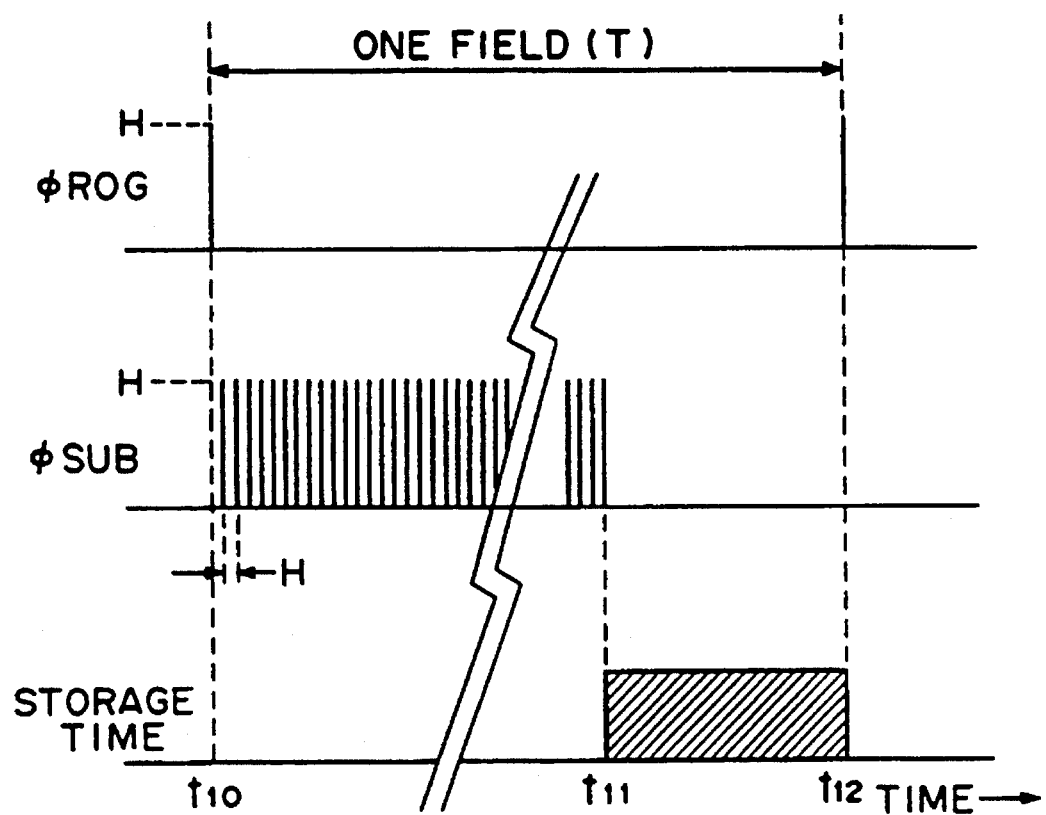
FIG. 5 is a timing chart showing various signals within one field of a standard television signal in the operation of an electronic shutter in the embodiment of the invention and in an example of the prior art.

FIG. 5 is a timing chart of various signals in one field interval T of a standard television signal. The φROG pulse is a pulse applied to the read-out gate (ROG) 15. When the logic level of this pulse is "H", the potential of the read-out gate (ROG) 15 falls and the electric charge in the sensor portion 10 is transferred to the vertical transfer register 11. An elimination pulse φSUB is a pulse applied to the substrate 16. When this pulse is "H", the electric charge which has accumulated in the sensor portion 10 is swept out (eliminated) to the exterior through a φSUB terminal.

In this example, as shown in FIG. 5, the φROG pulse is applied during the vertical retrace interval, and the φSUB pulse is applied during the horizontal retrace interval or in the proximity of the horizontal retrace interval. The reason for thus applying the φROG pulse and φSUB pulse during or in the proximity of the retrace intervals is to assure that noise which arises from these pulses will not appear in the picture.

After the electric charge of the sensor portion 10 is read out at time $t_{10}$, the next field interval begins. However, since φSUB attains the "H" level at every horizontal retrace interval up to time $t_{11}$, the electric charge which has accumulated from $t_{10}$ to $t_{11}$ does not remain in the sensor portion 10. Since φSUB is at the "L" level from time $t_{11}$ to time $t_{12}$, electric charge is stored in the sensor portion 10 during this time period. This charge is transferred to the vertical transfer register 11 by the "H"-level φROG pulse applied at time $t_{12}$. The end result is that the exposure time of the CCD 1 in this case becomes $(t_{12}-t_{11})$.

A video camera according to this embodiment will now be described in detail without respect to FIG. 1. In the construction of this video camera, only a CCD driver circuit 2' and a timing control circuit 4' in FIG. 1 differ from those of the prior-art example. No additional description of the construction is necessary.

Figure 3:
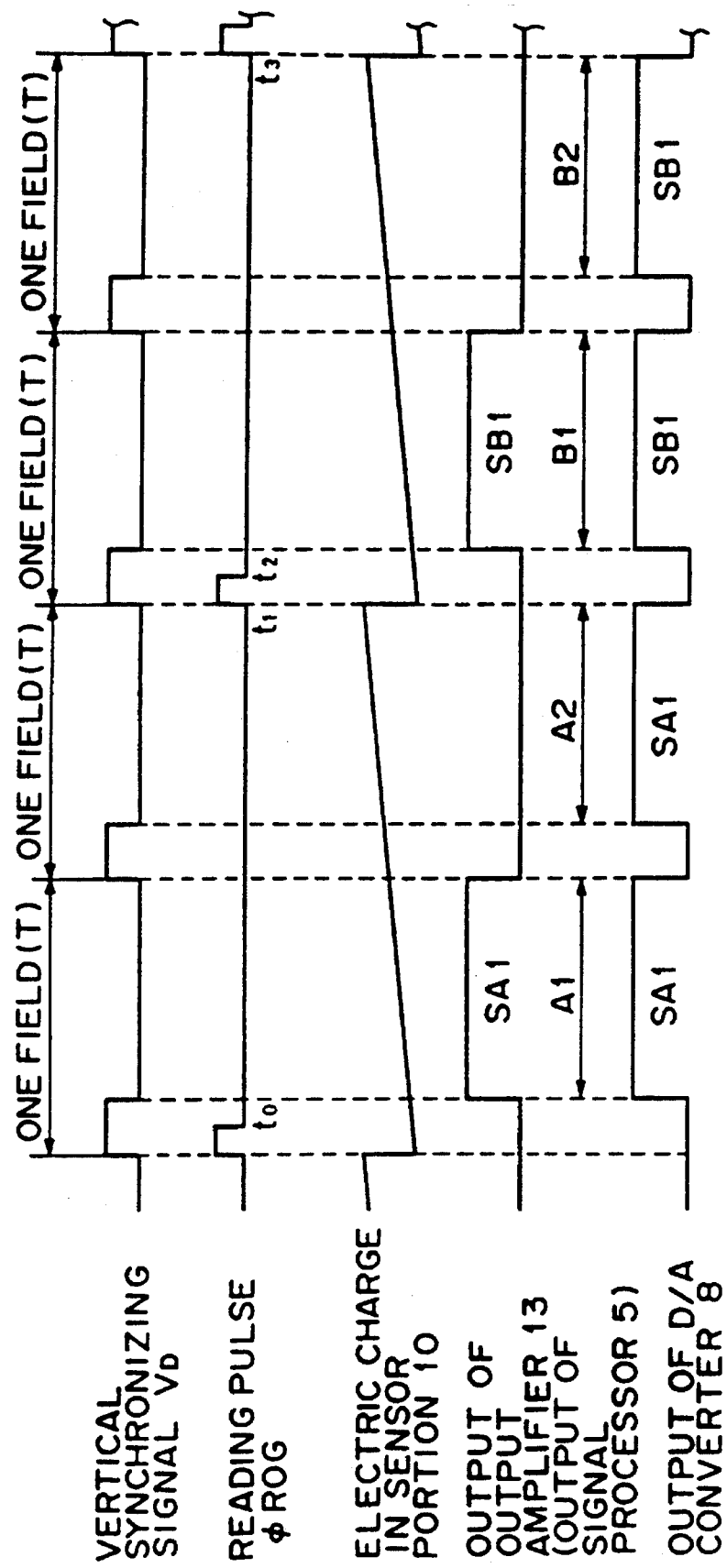
FIG. 3 is a timing chart of signals applied to various portions of the CCD of FIG. 1, output signals from various portions of the CCD, and signals generated by various portions of the CCD, all at the time of frame reading.
Figure 6:
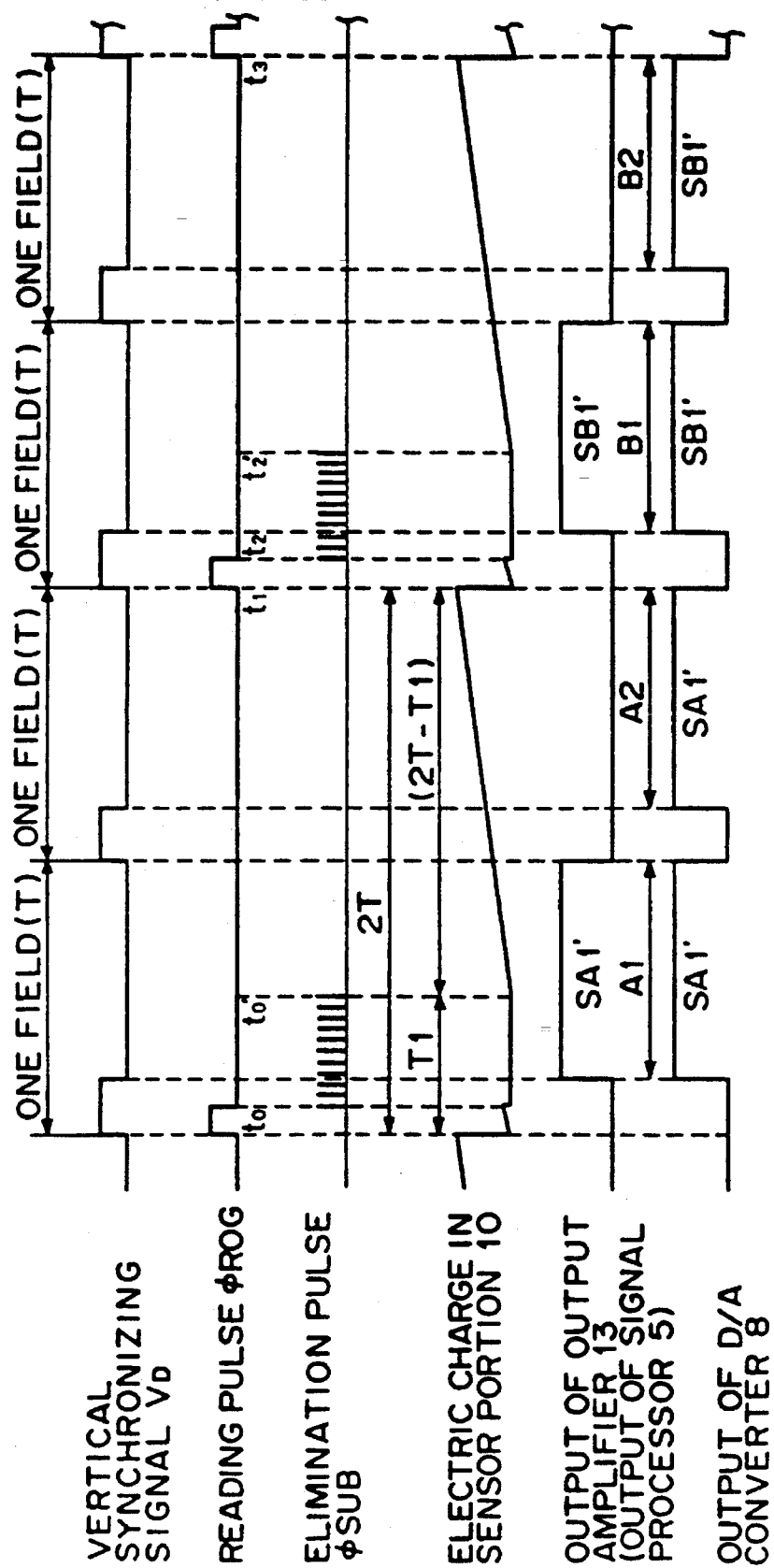
FIG. 6 is a timing chart illustrating the operation of the embodiment.

FIG. 6 is a timing chart showing the operation of the video camera. FIG. 6 illustrates the temporal change in each of the signals in the prior-art timing chart of long exposure time in FIG. 3 in a case where the elimination pulses φSUB are continuously applied to the CCD 1 every horizontal retrace interval from time $t_0$, at which storage of the charge in sensor portion 10 begins, to time $t_0'$.

Owing to application of the elimination pulses φSUB from time $t_0$ to time $t_0'$, the charge in the sensor portion 10 generated in the time period T1 from the start of one field interval until time $t_0'$ is eliminated. As a consequence, the substantial exposure time of CCD 1 is the time period from $t_0'$ to time $t_1$ (i.e., 2T-T1). In other words, it is possible to set an exposure time that is longer than one field interval T and shorter than two field intervals 2T. Through an operation the same as that of the prior art described earlier, an image signal SB1' formed from the electric charge that has accumulated in the sensor portion 10 from time $t_0'$ to time $t_1$ is continuously outputted from the D/A converting circuit 8 in the next two field intervals (intervals B1 and B2).

Accordingly, by changing the time $t_0'$, at which the operation of the elimination means ends, in conformity with the brightness of the subject, it becomes possible to set the exposure time (2T-T1) in such a manner that this exposure time having a length greater than one field interval is varied in continuous fashion.

In the operation described above, the CCD 1 is driven by the CCD driver circuit 2' controlled by the timing control circuit 4', the read-out pulse φROG is generated, the elimination pulse φSUB is generated, and the output amplifier 13 produces an output signal. The timing control circuit 4' controls the timing of each of these operations based upon the synchronizing signals outputted by the synchronizing signal generating circuit 3. The A/D converting circuit 6, image memory 7 and D/A converting circuit 8 are controlled by the timing control circuit 4'.

In accordance with the embodiment described above, the exposure time can be varied successively even if the exposure is for a time longer than one field interval T. As a result, even if the subject is not sufficiently illuminated, a fine exposure adjustment can be made in conformity with the brightness of the subject.

The present invention can be changed or modified in various ways within the scope of the claims. For example, though a CCD is used in the foregoing embodiment, another solid-state image sensor such as a MOS-type solid-state image sensor can be used. Further, though the elimination pulses are generated every horizontal retrace interval in the foregoing embodiment, an arrangement can be adopted in which these pulses are produced every several horizontal retrace intervals.

The present invention is not limited to the above embodiments and various changes and modifications can be made within the spirit and scope of the invention. Therefore, to apprise the public of the scope of the present invention, the following claims are made.

What is claimed is:

1. A camera comprising:

sensing means for receiving a light signal, performing a photoelectric conversion, and storing information;

reading means for reading the information from said sensing means once each reading period nT (where n is an integer equal to or greater than 2 and T is a field period of a standard television signal);

eliminating means for eliminating information from said sensing means, the eliminated information corresponding to a partial interval T1 within the reading period nT;

altering means for altering the width of the partial interval T1;

memory means for storing information outputted from said sensing means at a reading period nT; and memory control means for controlling said memory means in such a manner that the information stored in said memory means, is outputted at a field period T.

2. The camera according to claim 1, wherein a position at which the partial interval T1 begins substantially coincides with a position at which the reading period nT begins.

3. The camera according to claim 1, wherein the length of the partial interval T1 is altered by said altering means in such a manner that an information storage time (nT-T1) of said sensing means in one reading period nT substantially equals an exposure time.

4. The camera according to claim 1, wherein said eliminating means eliminates the information from said sensing means during a horizontal retrace interval of the standard television signal.

5. The camera according to claim 4, wherein the information in said sensing means is eliminated during substantially every horizontal retrace interval in the partial interval T1.

6. The camera according to claim 1, wherein said eliminating means eliminates the information from said sensing means at substantially the start or end of a horizontal retrace interval of the television signal.

7. The camera according to claim 6, wherein the information in said sensing means is eliminated at substantially every horizontal retrace interval in the partial interval T1.

8. An image sensing apparatus comprising:

an image sensing device for receiving a light signal, performing a photoelectric conversion on the light signal, and generating image information corresponding to the light signal, said device including:

a first type semiconductor substrate;

a second type semiconductor layer formed on the first type semiconductor substrate; and a light receiving portion formed on the second type semiconductor layer, said portion receiving a light signal, performing a photoelectric conversion on the light signal, and generating image information corresponding to the light signal;

control means for controlling said image sensing device such that image information is outputted repeatedly once each reading period nT (where n is an integer equal to or greater than 2 and T is a field period of a standard television signal) from the image sensing device, and such that information corresponding to a partial interval T1 within the reading period nT is carried to the first type semiconductor substrate; and altering means for altering the length of the partial interval T1.

9. The apparatus according to claim 8, wherein the first type semiconductor substrate comprises an n type semiconductor layer.

10. The apparatus according to claim 8, wherein the second type semiconductor layer includes a p-well.

11. The apparatus according to claim 8, wherein the light receiving portion includes a photodiode.

12. The apparatus according to claim 8, wherein the image information is carried to the first type semiconductor substrate by changing a level of a control signal supplied to the first type semiconductor substrate.

13. The apparatus according to claim 12, wherein the control signal is synchronized with a horizontal blanking signal of the standard television signal.

14. Image sensor apparatus having an image sensor and an electronic shuttering function, comprising:

control means for reading out signals from the image sensor in a first interval of a period of more than one integer number of field periods;

altering means for altering a period within said first interval for discharging some of the charges that have been accumulated in the image sensor;

memory means for storing signals read out from the image sensor in said first interval; and memory control means for controlling said memory means in such a manner that the signals are outputted at a field period.

15. Apparatus according to claim 14, wherein the image sensor is disposed on a substrate, and wherein said altering means discharges said some of the charges in a depth direction of the substrate in the image sensor.

16. Image sensor apparatus having an image sensor, comprising:

control means for reading out signals from the image sensor in a first interval of more than one integer number of field periods;

discarding means for discarding some of the charges accumulated in the image sensor within said first interval;

memory means for storing signals read out from the image sensor in said first interval of more than one integer number of field periods; and memory control means for controlling said memory means in such a manner that the signals are outputted at a field period.

17. Apparatus according to claim 16, wherein the image sensor is disposed on a substrate, and wherein said discarding means discards said some of the charges in a depth direction of the substrate in the image sensor.

18. Apparatus according to claim 16, wherein said discarding means discards some of the charges during a horizontal retrace interval.

19. Apparatus according to claim 16, wherein said discarding means discards some of the charges in a plurality of horizontal retrace intervals.

20. Apparatus according to claim 16, further comprising altering means for altering an amount of charges discarded by said discarding means.

* * * * *

UNITED STATES PATENT AND TRADEMARK OFFICE
CERTIFICATE OF CORRECTION

PATENT NO. : 5,488,416
DATED : January 30, 1996
INVENTOR(S) : KENJI KYUMA

It is certified that error appears in the above-indentified patent and that said Letters Patent is hereby corrected as shown below:

COLUMN 4

Line 67, "film" should read --film.--.

COLUMN 5

Line 32, "without" should read --with--.

COLUMN 6

Line 43, "means," should read --means--.

COLUMN 7

Line 25, "n type" should read --n-type--.

Signed and Sealed this

Eighteenth Day of June, 1996

Attest:

BRUCE LEHMAN

Attesting Officer      Commissioner of Patents and Trademarks